(12) United States Patent
Li

(10) Patent No.: US 11,145,842 B2
(45) Date of Patent: Oct. 12, 2021

(54) ORGANIC LIGHT EMITTING DIODE DISPLAY PANEL COMPRISING MULTI-LAYER ENCAPSULATION

(71) Applicant: WUHAN CHINA STAR OPTOELECTRONICS SEMICONDUCTOR DISPLAY TECHNOLOGY CO., LTD., Hubei (CN)

(72) Inventor: Zhao Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/334,372

(22) PCT Filed: Nov. 16, 2018

(86) PCT No.: PCT/CN2018/115794
§ 371 (c)(1),
(2) Date: Mar. 19, 2019

(87) PCT Pub. No.: WO2020/010772
PCT Pub. Date: Jan. 16, 2020

(65) Prior Publication Data
US 2020/0127234 A1 Apr. 23, 2020

(51) Int. Cl.
H01L 51/52 (2006.01)
H01L 27/32 (2006.01)
(Continued)

(52) U.S. Cl.
CPC .......... *H01L 51/5256* (2013.01); *H01L 21/56* (2013.01); *H01L 23/293* (2013.01);
(Continued)

(58) Field of Classification Search
CPC ......... H01L 21/56; H01L 23/28; H01L 23/29; H01L 27/3244; H01L 33/52;
(Continued)

(56) References Cited

U.S. PATENT DOCUMENTS

2012/0022181 A1 1/2012 Xu et al.
2016/0095172 A1* 3/2016 Lee ..................... C23C 16/401
313/504
(Continued)

FOREIGN PATENT DOCUMENTS

CN 102337052 A 2/2012
CN 104371131 A 2/2015
(Continued)

*Primary Examiner* — Eduardo A Rodela
*Assistant Examiner* — Christopher M Roland
(74) *Attorney, Agent, or Firm* — Mark M. Friedman

(57) ABSTRACT

The present application provides an organic light emitting diode (OLED) display panel and a package method thereof, the OLED display panel includes a thin film transistor layer, an OLED light emitting layer, and a thin film encapsulation layer, which are sequentially disposed on a substrate; the thin film encapsulation layer includes laminated disposing inorganic encapsulation layers and an organic encapsulation layer; wherein the material forming the organic encapsulation layer is methyl methacrylate-N-isopropyl acrylamide copolymer solution, which is spread on the surface of the inorganic encapsulation layer and after curing, used to form an organic encapsulation layer.

10 Claims, 1 Drawing Sheet

(51) Int. Cl.
*H01L 23/29* (2006.01)
*H01L 33/52* (2010.01)
*H01L 51/56* (2006.01)
*H01L 21/56* (2006.01)

(52) U.S. Cl.
CPC .......... *H01L 27/3244* (2013.01); *H01L 33/52* (2013.01); *H01L 51/56* (2013.01); *H01L 2251/301* (2013.01)

(58) Field of Classification Search
CPC ............. H01L 51/5237; H01L 51/5253; H01L 51/5256; H01L 51/56; H01L 2251/301; H01L 23/293
See application file for complete search history.

(56) References Cited

U.S. PATENT DOCUMENTS

| | | | |
|---|---|---|---|
| 2016/0111683 A1* | 4/2016 | Kachatryan | H01L 51/0097 257/40 |
| 2017/0279080 A1 | 9/2017 | Wang et al. | |
| 2017/0309699 A1* | 10/2017 | Oh | H01L 51/5253 |
| 2018/0122830 A1* | 5/2018 | Kachatryan | B32B 27/285 |
| 2018/0233700 A1* | 8/2018 | Li | H01L 51/5246 |
| 2019/0091950 A1* | 3/2019 | Hernandez Rueda | B29C 59/022 |
| 2019/0312226 A1* | 10/2019 | Huang | H01L 51/5256 |
| 2020/0020884 A1* | 1/2020 | Li | H01L 51/5253 |
| 2020/0083484 A1* | 3/2020 | Lee | H01L 51/5275 |
| 2020/0321554 A1* | 10/2020 | Qian | H01L 23/293 |
| 2021/0057498 A1* | 2/2021 | Pahk | H01L 51/56 |
| 2021/0126057 A1* | 4/2021 | Seo | H01L 27/323 |

FOREIGN PATENT DOCUMENTS

| | | | | |
|---|---|---|---|---|
| CN | 105047831 A | 11/2015 | | |
| CN | 105789257 A | 7/2016 | | |
| CN | 107564992 A | 1/2018 | | |
| CN | 107644946 A | 1/2018 | | |
| CN | 207265104 U | 4/2018 | | |
| WO | WO-2017167909 A1 * | 10/2017 | | B32B 3/30 |

* cited by examiner

ORGANIC LIGHT EMITTING DIODE DISPLAY PANEL COMPRISING MULTI-LAYER ENCAPSULATION

FIELD OF INVENTION

The present application relates to the field of display technologies, and in particular, to an OLED display panel and a package method thereof.

BACKGROUND OF INVENTION

In recent years, organic light emitting diode (OLED) display technology has advanced by leaps and bounds. OLED products are attracting more and more people's attention due to their advantages such as being light weight, fast response times, wide viewing angles, high contrast, and being bendable. It is mainly used in the display field such as mobile phones, tablets, and televisions.

An OLED display panel includes, from bottom to top, a substrate, a thin film transistor layer, an OLED emissive layer, a first inorganic encapsulation layer, an organic encapsulation layer, a second inorganic encapsulation layer and the like. The organic encapsulation layer mainly gives the effects of planarization and blocking the transmission of water and oxygen. Generally, the organic encapsulation layer is prepared by IJP (inkjet printing) method, that is, dropping the ink on the first inorganic encapsulation layer, spread the ink on the layer to a leveled condition, and then cured the ink to form the organic encapsulation layer. PMMA (poly (methyl methacrylate), also known as plexiglass) is widely selected as an organic encapsulation layer material due to its high transparency and a certain degree of water absorption.

However, since the first inorganic encapsulation layer is hydrophilic, the monomer MMA of the organic encapsulation layer PMMA is hydrophobic, and when the organic encapsulation layer is prepared, the ink droplets are difficult to flow level on the first inorganic encapsulation layer, and instead are aggregated into a plurality of ink droplets, the through-voids may formed in the prepared organic encapsulation layer, which causes external water and oxygen and other impurities to easily intrudes into the interior of the OLED panel from these holes, causing the OLED device to be oxidized and causing a decrease in lifetime and the like.

Therefore, it is necessary to provide an OLED display panel and a package method thereof to solve the problems existing in the prior art.

SUMMARY OF INVENTION

The present application provides an OLED display panel and a package method thereof, which can reduce voids in the organic encapsulation layer, improve the barrier property of the organic encapsulation layer to water and oxygen, reduce the risk of oxidation of devices inside the OLED display panel, and increase the lifetime of the OLED device.

To achieve the above objective, the technical solution provided by the present application is as follows:

The application provides an organic light emitting diode (OLED) display panel includes:
a substrate; a thin film transistor layer prepared on the substrate; an OLED emissive layer prepared on the thin film transistor layer; a thin film encapsulation layer prepared on the OLED emissive layer and used to encapsulate the OLED emissive layer; the thin film encapsulation layer includes the laminated disposing inorganic encapsulation layers and the organic encapsulation layer; wherein the material for forming the organic encapsulation layer is methyl methacrylate-N-isopropyl acrylamide copolymer solution, the methyl methacrylate-N-isopropyl acrylamide copolymer solution is spread on the surface of the inorganic encapsulation layer and is used to form the organic encapsulation layer after curing, and the thickness of the film layer at different positions of the organic encapsulation layer is uniform.

In the OLED display panel of the present application, the methyl methacrylate-N-isopropyl acrylamide copolymer solution is formed by subjecting the mixed solution of methyl methacrylate, N-isopropyl acrylamide, and a photopolymerization initiator to light irradiation.

In the OLED display panel of the present application, the methyl methacrylate, the N-isopropyl acrylamide, and the photopolymerization initiator are mixed in a predetermined ratio to form the mixed solution.

In the OLED display panel of the present application, a mass concentration of the N-isopropyl acrylamide in the mixed solution ranges from 0.05%-20%.

In the OLED display panel of the present application, the methyl methacrylate-N-isopropyl acrylamide copolymer contained in the methyl methacrylate-N-isopropyl acrylamide copolymer solution has the hydrophilic end and the hydrophobic end.

In the OLED display panel of the present application, the methyl methacrylate-N-isopropyl acrylamide copolymer is distributed in such a manner that the hydrophilic end is adjacent to the inorganic encapsulation layer and the hydrophobic end is away from the inorganic encapsulation layer.

In the OLED display panel of the present application, the methyl methacrylate-N-isopropyl acrylamide copolymer is a copolymer formed of poly (methyl methacrylate) and poly (N-isopropyl acrylamide).

To achieve the above objective, the present application further provides a method for packaging an OLED display panel, the method including the following steps: step S10, providing an OLED display panel to be packaged, and preparing an inorganic encapsulation layer on the OLED display panel;

step S20, forming a mixed solution containing methyl methacrylate, N-isopropyl acrylamide, and the photopolymerization initiator on the surface of the inorganic encapsulation layer;

step S30, performing a curing process, firstly, the mixed solution is subjected to light irradiation for forming a methyl methacrylate-N-isopropyl acrylamide copolymer solution, such that the methyl methacrylate-N-isopropyl acrylamide copolymer solution is spread on the surface of the inorganic encapsulation layer and to form an organic encapsulation layer after curing; step S40, forming a layer of the inorganic encapsulation layer on the surface of the organic encapsulation layer.

In the encapsulation method of the present application, the step S20 specifically includes the following steps:
step S201, mixing the methyl methacrylate, the N-isopropyl acrylamide, and the photopolymerization initiator in a predetermined ratio to form the mixed solution; step S202, forming the mixed solution on the surface of the inorganic encapsulation layer by inkjet printing.

In the package method of the present application, a mass concentration of the N-isopropyl acrylamide in the mixed solution ranges from 0.05%-20%.

In the package method of the present application, the step S30 specifically includes the following steps:

step S301, the N-isopropyl acrylamide in the mixed solution is hydrophilic, and first moving to the surface of the inorganic encapsulation layer for spreading;

step S302, under the effect of the photopolymerization initiator, the methyl methacrylate and the N-isopropyl acrylamide in the mixed solution are polymerized to form a methyl methacrylate-N-isopropyl acrylamide copolymer having a hydrophilic end, the methyl methacrylate-N-isopropyl acrylamide copolymer moves toward the surface of the inorganic encapsulation layer, and the side having the hydrophilic end is adjacent to the inorganic encapsulation layer;

step S303, after the methyl methacrylate-N-isopropyl acrylamide copolymer solution is spread over the inorganic encapsulation layer, it is cured to form the organic encapsulation layer.

To achieve the above objective, the present application further provides an OLED display panel includes: a substrate; a thin film transistor layer prepared on the substrate; an OLED emissive layer prepared on the thin film transistor layer; a thin film encapsulation layer prepared on the OLED emissive layer and used to encapsulate the OLED emissive layer; the thin film encapsulation layer includes the laminated disposing inorganic encapsulation layers and the organic encapsulation layer; wherein the materials forming the organic encapsulation layer is methyl methacrylate-N-isopropyl acrylamide copolymer solution, the methyl methacrylate-N-isopropyl acrylamide copolymer solution is spread on the surface of the inorganic encapsulation layer and is used to form the organic encapsulation layer after curing.

In the OLED display panel of the present application, the methyl methacrylate-N-isopropyl acrylamide copolymer solution is formed by subjecting the mixed solution of methyl methacrylate, N-isopropyl acrylamide, and a photopolymerization initiator to light irradiation.

In the OLED display panel of the present application, the methyl methacrylate, the N-isopropyl acrylamide, and the photopolymerization initiator are mixed in a predetermined ratio to form the mixed solution.

In the OLED display panel of the present application, a mass concentration of the N-isopropyl acrylamide in the mixed solution ranges from 0.05%-20%.

In the OLED display panel of the present application, the methyl methacrylate-N-isopropyl acrylamide copolymer contained in the methyl methacrylate-N-isopropyl acrylamide copolymer solution has the hydrophilic end and the hydrophobic end.

In the OLED display panel of the present application, the methyl methacrylate-N-isopropyl acrylamide copolymer is distributed in such a manner that the hydrophilic end is adjacent to the inorganic encapsulation layer and the hydrophobic end is away from the inorganic encapsulation layer.

In the OLED display panel of the present application, the methyl methacrylate-N-isopropyl acrylamide copolymer is a copolymer formed of poly (methyl methacrylate) and poly (N-isopropyl acrylamide).

Beneficial Effect

The present application provides the OLED display panel and the package method thereof, compared with the prior art of general package technology and other improved package technologies, the present application reduces the voids in the organic encapsulation layer by introducing an amphiphilic methyl methacrylate-N-isopropyl acrylamide copolymer (PMMA-PNIPAm) organic layer without changing the original process.

The preparation process introduces a hydrophilic poly (N-isopropyl acrylamide) (PNIPAm), so that the mixed solution (ink) can be easily spread on the inorganic encapsulation layer, thereby reducing voids in the organic encapsulation layer, improving the barrier property of organic encapsulation layer to water and oxygen, and reducing the risk of oxidation of devices inside the OLED display panel, thereby, increasing the lifetime of the OLED device.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DETAILED DESCRIPTION OF PREFERRED EMBODIMENTS

The technical solutions in the embodiments of the present invention will be clearly and completely described as follows with reference to the drawings in the embodiments of the present invention. Obviously, the described embodiments are a part of the embodiments in the invention, not all of them. Based on the embodiments of the present invention, all other embodiments obtained by those skilled in the field without doing any creative activity are within the claimed scope of the present invention.

In the description of the present invention, the terms "first" and "second" are used for descriptive purpose only and are not to be construed as indicating or implying a relative importance or implicitly indicating the number of the specified technical features. Thus, the features defining "first" or "second" may include one or more described features either explicitly or implicitly. In the description of the present invention, the meaning of "a plurality of" denotes two or more unless it is otherwise specifically stated.

The present application is directed to an OLED display panel and a package structure thereof of the prior art. Since the voids are easy to form in the organic encapsulation layer during the preparation process, so that the barrier property of the organic encapsulation layer to water and oxygen is reduced, thereby increasing the risk of oxidation of the device inside the OLED display panel and causing the technical problem of the lifetime of the OLED device. The present embodiment can solve the problem.

Figure 1:
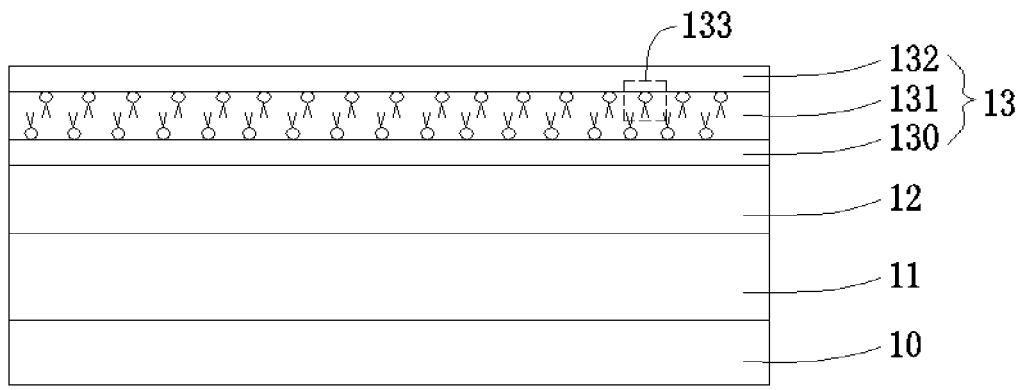
FIG. 1 is a schematic cross-sectional view of an OLED display panel according to an embodiment of the present application.

FIG. 1 is a schematic cross-sectional view of an OLED display panel according to an embodiment of the present application. The OLED display panel includes: a substrate 10; a thin film transistor layer 11 prepared on the substrate 10; an OLED emissive layer 12 prepared on the thin film transistor layer 11; and a thin film encapsulation layer 13 prepared on the OLED emissive layer 12 and used to encapsulate the OLED emissive layer 12; the thin film encapsulation layer 13 includes the laminated disposing inorganic encapsulation layers and the organic encapsulation layer; the thin film encapsulation layer 13 is illustrated to include a first inorganic encapsulation layer 130, an organic encapsulation layer 131, and a second inorganic encapsulation layer 132. The preparation methods of the first inorganic encapsulation layer 130 and the second inorganic encapsulation layer 132 are similar to the prior art, and the details are not described herein.

The material of the organic encapsulation layer 131 is methyl methacrylate-N-isopropyl acrylamide copolymer solution, the methyl methacrylate-N-isopropylacrylamide copolymer solution is formed by mixing of methyl methacrylate, N-isopropyl acrylamide and a photopolymerization initiator in a predetermined ratio, and then subjecting the mixed solution to light irradiation.

The mass concentration of the N-isopropyl acrylamide in the mixed solution ranges from 0.05%-20%.

Preferably, the mass concentration of the N-isopropyl acrylamide in the mixed solution ranges from 0.1%-10%.

The organic encapsulation layer 131 contains a methyl methacrylate-N-isopropyl acrylamide copolymer 133, that is, the methyl methacrylate-N-isopropyl acrylamide copolymer solution contains methyl methacrylate-N-isopropyl acrylamide copolymer 133, the methyl methacrylate-N-isopropyl acrylamide copolymer 133 has the hydrophilic end and the hydrophobic end and is distributed in such a manner that the hydrophilic end is adjacent to the first inorganic encapsulation layer 130 and the hydrophobic end is away from the inorganic encapsulation layer 130. The methyl methacrylate-N-isopropylacrylamide copolymer 133 is a copolymer formed of poly (methyl methacrylate) and poly (N-isopropyl acrylamide).

The mixed solution is formed on the surface of the first inorganic encapsulation layer 130 by inkjet printing, the photopolymerization initiator functions under a certain condition, the methyl methacrylate-N-isopropylacrylamide copolymer solution is formed and spread on the surface of the first inorganic encapsulation layer 130, after curing, the organic encapsulation layer 131 having a uniform film thickness is formed. The surface of the organic encapsulation layer 131 is flat, and no void is generated.

Figure 2:
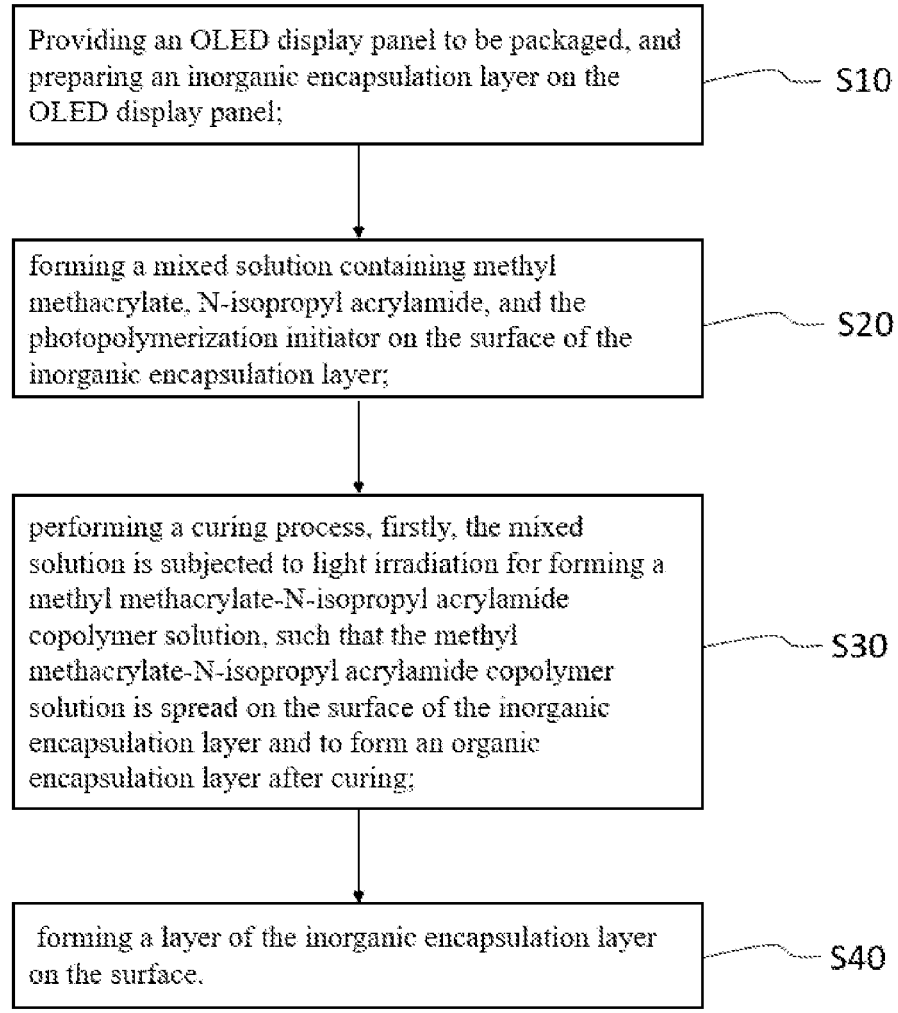
FIG. 2 is a flowchart of a method for packaging an OLED display panel according to an embodiment of the present application.

The present application also provides a method for packaging an OLED display panel. As shown in FIG. 2, the method includes the following steps:

step S10, providing an OLED display panel to be packaged, and preparing an inorganic encapsulation layer on the OLED display panel; wherein, the inorganic encapsulation layer is hydrophilic, and the material of the inorganic encapsulation layer is an inorganic substance such as SiN or SiO$_2$, the preparation method of the inorganic encapsulation layer is similar to that in the prior art, and the details are not described herein.

Step S20, forming a mixed solution containing methyl methacrylate (MMA), N-isopropylacrylamide (NIPAm), and photopolymerization initiator on the surface of the inorganic encapsulation layer, specifically, the step S20 includes the following steps:

step S201, mixing the methyl methacrylate, the N-isopropyl acrylamide, and the photopolymerization initiator in a predetermined ratio to form the mixed solution; wherein, the mass concentration of the N-isopropyl acrylamide in the mixed solution ranges from 0.05%-20%, preferably from 0.1%-10%. Other solvents such as a catalyst may also be included in the mixed solution, and are not limited herein. Further, the photopolymerization initiator may be of a conventional kind and is not limited herein.

Step S202, forming the mixed solution on the surface of the inorganic encapsulation layer by inkjet printing; wherein the N-isopropyl acrylamide is an oil-water amphiphilic polar small molecule and is easily bonded to the surface of the inorganic encapsulation layer. The methyl methacrylate is a hydrophobic organic substance and is not easily combined with the hydrophilic inorganic encapsulation layer. When the mixed solution (ink) containing the methyl methacrylate and the N-isopropyl acrylamide is added dropwise to the surface of the inorganic encapsulation layer, the hydrophilic monomer in the droplet is the N-isopropyl acrylamide is easily spread on the surface of the inorganic encapsulation layer.

Step S30, performing a curing process, firstly, the mixed solution is irradiated by light to form a methyl methacrylate-N-isopropyl acrylamide copolymer solution, so that the methyl methacrylate-N-isopropyl acrylamide copolymer solution is spread on the surface of the inorganic encapsulation layer and is cured to form an organic encapsulation layer. Specifically, the step S30 includes the following steps:

step S301, the N-isopropyl acrylamide in the mixed liquid is hydrophilic, and is first spread to the surface of the inorganic encapsulation layer for spreading.

Step S302, under the function of the photopolymerization initiator, the methyl methacrylate and the N-isopropyl acrylamide in the mixed solution are polymerized to form a methyl methacrylate-N-isopropyl acrylamide copolymer (PMMA-PNIPAm) having the hydrophilic end, the methyl methacrylate-N-isopropyl acrylamide copolymer moves toward the surface of the inorganic encapsulation layer, and the side having the hydrophilic end is close to the inorganic encapsulation layer; wherein the photopolymerization initiator can initiate the polymerization of methyl methacrylate and the N-isopropyl acrylamide, the methyl methacrylate is first polymerized to form poly (methyl methacrylate) (PMMA), and the N-isopropyl acrylamide is polymerized to form poly (N-isopropyl acrylamide) (PNIPAm), the poly (N-isopropyl acrylamide) has hydrophilicity, then, under the further effect of the photopolymerization initiator, the poly (methyl methacrylate) is polymerized with the poly (N-isopropyl acrylamide) to form the methyl methacrylate-N-isopropyl acrylamide copolymer; wherein, the methyl methacrylate-N-isopropylacrylamide copolymer molecule, on which the moiety having a methyl methacrylate group is a hydrophobic end, on which the moiety having an N-isopropyl acrylamide group is a hydrophilic end, the hydrophilic end is closer to the inorganic encapsulation layer. The poly (methyl methacrylate) (also known as plexiglass) is widely selected as the material of the organic encapsulation layer due to its high transparency and certain water absorption.

Step S303, the methyl methacrylate-N-isopropyl acrylamide copolymer solution is spread over the inorganic encapsulation layer, and then cured to form the organic encapsulation layer; wherein, since the methyl methacrylate-N-isopropylacrylamide copolymer solution contains a hydrophilic N-isopropyl acrylamide molecule and group, allowing the methyl methacrylate-N-isopropyl acrylamide copolymer solution to cover the surface of the inorganic encapsulation layer, thereby avoiding voids in the organic encapsulation layer, and the ability of the organic encapsulation layer to block water and oxygen is improved.

Step S40, forming a layer of the inorganic encapsulation layer on the surface of the organic encapsulation layer; wherein, the inorganic encapsulation layer and the organic encapsulation layer can be sequentially laminated on the OLED display panel.

The present application provides the OLED display panel and the package method thereof, compared with the prior art of general package technology and other improved package technologies, the present application reduces the voids in the organic encapsulation layer by introducing an amphiphilic methyl methacrylate-N-isopropyl acrylamide copolymer (PMMA-PNIPAm) organic layer without changing the original process. The preparation process introduces a hydrophilic poly (N-isopropyl acrylamide) (PNIPAm), so that the mixed solution (ink) can be easily spread on the inorganic encapsulation layer, thereby reducing voids in the organic encapsulation layer, improving the barrier property of organic encapsulation layer to water and oxygen, and reducing the risk of oxidation of devices inside the OLED display panel, thereby, increasing the lifetime of the OLED device.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

The invention claimed is:

1. An organic light emitting diode (OLED) display panel, comprising:
   a substrate;
   a thin film transistor layer disposed on the substrate;
   an OLED emissive layer disposed on the thin film transistor layer;
   a thin film encapsulation layer disposed on the OLED emissive layer and used to encapsulate the OLED emissive layer; wherein the thin film encapsulation layer comprises a hydrophilic first inorganic encapsulation layer, a hydrophilic second inorganic encapsulation layer, and an amphiphilic organic encapsulation layer;
   wherein material of the organic encapsulation layer comprises methyl methacrylate-N-isopropyl acrylamide copolymers, the organic encapsulation layer is disposed directly on the first inorganic encapsulation layer, the second inorganic encapsulation layer is disposed directly on the organic encapsulation layer, and the organic encapsulation layer has a uniform thickness; and
   wherein the methyl methacrylate-N-isopropyl acrylamide copolymers located at an interface between the organic encapsulation layer and the first inorganic encapsulation layer are distributed in a way that hydrophilic ends of the methyl methacrylate-N-isopropyl acrylamide copolymers are close to the first inorganic encapsulation layer and hydrophobic ends of the methyl methacrylate-N-isopropyl acrylamide copolymers are away from the first inorganic encapsulation layer, and the methyl methacrylate-N-isopropyl acrylamide copolymers located at an interface between the organic encapsulation layer and the second inorganic encapsulation layer are distributed in a way that hydrophilic ends of the methyl methacrylate-N-isopropyl acrylamide copolymers are close to the second inorganic encapsulation layer and hydrophobic ends of the methyl methacrylate-N-isopropyl acrylamide copolymers are away from the second inorganic encapsulation layer.

2. The OLED display panel according to claim 1, wherein each of the methyl methacrylate-N-isopropyl acrylamide copolymers is formed by subjecting a mixed solution of methyl methacrylate, N-isopropyl acrylamide, and a photopolymerization initiator to light irradiation.

3. The OLED display panel according to claim 2, wherein the methyl methacrylate, the N-isopropyl acrylamide, and the photopolymerization initiator are mixed in a predetermined ratio to form the mixed solution.

4. The OLED display panel according to claim 3, wherein a mass concentration of the N-isopropyl acrylamide in the mixed solution ranges from 0.05%-20%.

5. The OLED display panel according to claim 1, wherein each of the methyl methacrylate-N-isopropyl acrylamide copolymers is a copolymer formed by poly (methyl methacrylate) and poly (N-isopropyl acrylamide).

6. An organic light emitting diode (OLED) display panel, comprising:
   a substrate;
   a thin film transistor layer disposed on the substrate;
   an OLED emissive layer disposed on the thin film transistor layer;
   a thin film encapsulation layer disposed on the OLED emissive layer and used to encapsulate the OLED emissive layer;
   wherein the thin film encapsulation layer comprises a hydrophilic first inorganic encapsulation layer, a hydrophilic second inorganic encapsulation layer, and an amphiphilic organic encapsulation layer;
   wherein material of the organic encapsulation layer comprises methyl methacrylate-N-isopropyl acrylamide copolymers, the organic encapsulation layer is disposed directly on the first inorganic encapsulation layer, and the second inorganic encapsulation layer is disposed directly on the organic encapsulation layer; and
   wherein the methyl methacrylate-N-isopropyl acrylamide copolymers located at an interface between the organic encapsulation layer and the first inorganic encapsulation layer are distributed in a way that hydrophilic ends of the methyl methacrylate-N-isopropyl acrylamide copolymers are close to the first inorganic encapsulation layer and hydrophobic ends of the methyl methacrylate-N-isopropyl acrylamide copolymers are away from the first inorganic encapsulation layer, and the methyl methacrylate-N-isopropyl acrylamide copolymers located at an interface between the organic encapsulation layer and the second inorganic encapsulation layer are distributed in a way that hydrophilic ends of the methyl methacrylate-N-isopropyl acrylamide copolymers are close to the second inorganic encapsulation layer and hydrophobic ends of the methyl methacrylate-N-isopropyl acrylamide copolymers are away from the second inorganic encapsulation layer.

7. The OLED display panel according to claim 6, wherein each of the methyl methacrylate-N-isopropyl acrylamide copolymers is formed by subjecting a mixed solution of methyl methacrylate, N-isopropyl acrylamide, and a photopolymerization initiator to light irradiation.

8. The OLED display panel according to claim 7, wherein the methyl methacrylate, the N-isopropyl acrylamide, and the photopolymerization initiator are mixed in a predetermined ratio to form the mixed solution.

9. The OLED display panel according to claim 8, wherein a mass concentration of the N-isopropyl acrylamide in the mixed solution ranges from 0.05%-20%.

10. The OLED display panel according to claim 6, wherein each of the methyl methacrylate-N-isopropyl acrylamide copolymers is a copolymer formed by poly (methyl methacrylate) and poly (N-isopropyl acrylamide).

\* \* \* \* \*

UNITED STATES PATENT AND TRADEMARK OFFICE
CERTIFICATE OF CORRECTION

PATENT NO. : 11,145,842 B2  
APPLICATION NO. : 16/334372  
DATED : October 12, 2021  
INVENTOR(S) : Zhao Li Page 1 of 1

It is certified that error appears in the above-identified patent and that said Letters Patent is hereby corrected as shown below:

On the Title Page

Column 1, item (30) should be added as follows:  
Foreign Application Priority Data  
July. 10, 2018 (CN) ........................... 201810749501.8

Signed and Sealed this  
Twenty-third Day of August, 2022

Katherine Kelly Vidal  
*Director of the United States Patent and Trademark Office*